United States Patent
Nam et al.

(10) Patent No.: US 9,732,423 B2
(45) Date of Patent: Aug. 15, 2017

(54) DRY COATING APPARATUS

(75) Inventors: Kyung-Hoon Nam, Gwangyang-si (KR); Mun-Jong Eom, Gwangyang-si (KR); Young-Jin Kwak, Gwangyang-si (KR); Woo-Sung Jung, Gwangyang-si (KR); Tae-Yeob Kim, Gwangyang-si (KR); Dong-Yoeul Lee, Gwangyang-si (KR); Seok-Jun Hong, Gwangyang-si (KR); Kyoung-Bo Kim, Gwangyang-si (KR); Yong-Hwa Jung, Gwangyang-si (KR); Sang-Hoon Park, Gwangyang-si (KR); Sang-Cheol Lee, Gwangyang-si (KR); Yang-Woo Nam, Gwangyang-si (KR)

(73) Assignee: POSCO, Pohang-si (KR)

( * ) Notice: Subject to any disclaimer, the term of this patent is extended or adjusted under 35 U.S.C. 154(b) by 747 days.

(21) Appl. No.: 13/824,566

(22) PCT Filed: Dec. 26, 2011

(86) PCT No.: PCT/KR2011/010112
§ 371 (c)(1),
(2), (4) Date: Mar. 18, 2013

(87) PCT Pub. No.: WO2012/091390
PCT Pub. Date: Jul. 5, 2012

(65) Prior Publication Data
US 2013/0186339 A1    Jul. 25, 2013

(30) Foreign Application Priority Data
Dec. 27, 2010  (KR) .................. 10-2010-0136124

(51) Int. Cl.
*C23C 16/448* (2006.01)
*C23C 14/24* (2006.01)
(Continued)

(52) U.S. Cl.
CPC ............ *C23C 16/448* (2013.01); *C23C 14/24* (2013.01); *C23C 14/243* (2013.01);
(Continued)

(58) Field of Classification Search
CPC ..... C23C 16/448; C23C 14/26; C23C 14/243; C23C 14/246; C23C 14/24
(Continued)

(56) References Cited

U.S. PATENT DOCUMENTS 2,157,478 A * 5/1939 Burkhardt ............. C23C 14/228
                                                118/723 VE
3,059,612 A * 10/1962 Baughman ............ C23C 14/246
                                                118/727
(Continued)

FOREIGN PATENT DOCUMENTS

CN      1636077 A     7/2005
CN    101622372 A     1/2010
(Continued)

*Primary Examiner* — Gordon R Baldwin
*Assistant Examiner* — Aiden Lee
(74) *Attorney, Agent, or Firm* — The Webb Law Firm

(57) ABSTRACT

Provided is a dry coating apparatus for coating a coating material, i.e., deposition vapor (metal vapor) on a substrate (a steel strip). The dry coating apparatus includes a coating part disposed in a vacuum to coat deposition vapor generated through heating and evaporation of a supplied coating material onto a proceeding object to be coated and a heating source disposed in an atmosphere to heat and levitate the coating material in the coating part.

5 Claims, 4 Drawing Sheets

(51) Int. Cl.
*C23C 14/56* (2006.01)
*C23C 14/26* (2006.01)

(52) U.S. Cl.
CPC ............ *C23C 14/246* (2013.01); *C23C 14/26* (2013.01); *C23C 14/562* (2013.01)

(58) Field of Classification Search
USPC .................................................. 118/726, 727
See application file for complete search history.

(56) References Cited

U.S. PATENT DOCUMENTS

| | | | |
|---|---|---|---|
| T988,002 I4 * | 11/1979 | Ohta | ..................... C23C 14/246 118/719 |
| 4,385,080 A * | 5/1983 | de Rudnay | ............. C23C 14/26 427/250 |
| 5,002,837 A * | 3/1991 | Shimogori | ............... C23C 14/16 428/621 |
| 5,632,820 A * | 5/1997 | Taniyama | ........... C23C 16/4401 118/715 |
| 5,747,780 A * | 5/1998 | Shioyama | ......... H01L 21/67784 118/719 |
| 7,323,229 B2 | 1/2008 | Van Westrum et al. | |
| 2003/0203638 A1 * | 10/2003 | Van Slyke | .............. C23C 14/12 438/709 |
| 2005/0064110 A1 | 3/2005 | Van Westrum et al. | |
| 2010/0015361 A1 | 1/2010 | Negishi | |
| 2010/0092666 A1 * | 4/2010 | Morisaki | ................ C23C 16/325 427/248.1 |

FOREIGN PATENT DOCUMENTS

| | | | |
|---|---|---|---|
| JP | 59177364 | 10/1984 | |
| JP | 02-019460 A | 1/1990 | |
| JP | 06093430 | 4/1994 | |
| JP | 08104981 A | 4/1996 | |
| JP | 08158043 A | 6/1996 | |
| JP | 10-154329 A | 6/1998 | |
| JP | 2005-523381 A | 8/2005 | |
| JP | 2008-150678 A | 8/2008 | |
| JP | 2008-542537 A | 11/2008 | |
| KR | 1020040085192 A | 10/2004 | |
| KR | 2006-0087918 A | 8/2006 | |
| KR | WO 2010110615 A2 * | 9/2010 | ........... C23C 14/243 |
| KR | 1020110030127 A | 3/2011 | |
| KR | 1020110035070 A | 4/2011 | |
| KR | 1020110038343 A | 4/2011 | |
| WO | 03/071000 A1 | 8/2003 | |
| WO | 03071000 A1 | 8/2003 | |
| WO | 2006/128532 A1 | 12/2006 | |

* cited by examiner

PRIOR ART

DRY COATING APPARATUS

TECHNICAL FIELD

The present invention relates to a dry coating apparatus for the coating of a coating material, i.e., metal vapor, on a substrate (e.g., a steel strip) through deposition, and more particularly, to a dry coating apparatus in which an electro-magnetic coil that is a heating source is disposed in an atmosphere to remove the possibility of an arcing due to an existing electro-magnetic coil being disposed in a vacuum and to omit related components, thereby improving operational stability, a simplified structure may be enabled and metal vapor generation capacity increased to realize high-speed coating, thereby improving productivity and reducing power consumption.

BACKGROUND ART

A coating material, for example, metal vapor, may be coated on a surface of a steel strip through various well-known methods such as a deposition method in which a coating material is coated on a substrate, e.g., a continuous (high-speed) proceeding steel strip in a vacuum. In vacuum deposition, a solid or liquid coating material (e.g., a metal or coating material) is heated and evaporated through various methods in a vacuum and is converted into a vaporous (gaseous) state. Thus, the solid or liquid coating material having the vaporous (gaseous) state is deposited on the steel strip to form a thin film.

The continuous coating of the substrate (e.g., steel strip) through vacuum deposition may be classified according to heating method. Representative examples of continuous coating may include thermal evaporation and electron beam evaporation. Studies with respect to electro-magnetic levitation evaporation for realizing high-speed deposition have been undertaken in recent years.

In electro-magnetic levitation evaporation, a coating material is surrounded by an electro-magnetic coil, and a high frequency AC current generated by high frequency power is applied to the electro-magnetic coil. Here, the coating material is heated by the generated electro-magnetic fields to allow the coating material to be levitated. Thus, a relatively large amount of metal vapor may be deposited and coated on the surface of the steel strip, continuously moved at a high speed, with reduced heat loss when compared metal vapor generated in an existing crucible.

FIG. 1 illustrates a dry (continuous) coating apparatus using an electro-magnetic coil disclosed in Korean patent application No. 2009-0095597 filed by the same applicant of this application.

Referring to FIG. 1, in a dry coating apparatus 100 according to a related art, an electro-magnetic coil 130 for levitating and heating a coating material 112 is disposed in a vacuum V within a chamber 120 through which a substrate (e.g., a steel strip) 110 continuously passes. In addition, the solid or liquid coating material 112 supplied through a supply unit (not shown) is levitated and heated by electro-magnetic force generated in the electro-magnetic coil 130 when a high frequency current is applied thereto, thereby generating a deposition vapor (hereinafter, referred to as "metal vapor") 114.

Here, the metal vapor 114, generated while the coating material 112 is levitated and heated, is injected onto the substrate 110 through a vapor inducing unit 140 and a vapor injection unit 150 to perform dry coating.

However, in case of the related art dry coating apparatus 100 disclosed in the above-described patent application, since a coating material to be coated on a substrate is substantially evaporated and disposed in the chamber 120 having the vacuum V and including a steel strip transfer roll 122, there is a limitation that an arcing may occur between the electro-magnetic coils 130, i.e., between turning portions of a winding part 130a or between the electro-magnetic coil 130 and an external conductor due to a high frequency AC current applied to the electro-magnetic coils 130 as shown in FIG. 2.

Thus, in the case of the related art dry coating apparatus 100, to prevent an arcing when the high frequency AC current is applied thereto while in the vacuum V, an insulation structure surrounding the electro-magnetic coil is required. Thus, there is a limitation that the dry coating apparatus 100 has a complicated structure.

For example, an insulation structure for preventing arcing by the electro-magnetic coil (i.e., a high frequency coil) 130 is disclosed in Korean patent application No. 2009-0088117 filed by the same applicant of this application.

Referring to FIG. 2, an insulator 210 surrounds the outside (the winding part 130a) of the electro-magnetic coil (the high frequency coil) 130 used in the related art dry coating apparatus 100 and a castable or a filler 220 for a ceramic is filled in the electro-magnetic coil 130 to realize an insulation structure 200.

Thus, in the case of the related art dry coating apparatus 100, a separate insulation structure for preventing an arcing in the electro-magnetic coil is required. Accordingly, there are limitations that the apparatus is complicated due to component construction and also cost for constructing and maintaining the equipment increase.

In the related art electro-magnetic coil having the insulation structure for preventing the arcing, since vibration occurs at the coil winding part 130a when a high frequency power is applied, cracks may occur in the insulation structure 200. As a result, arcing may occur at the cracked portions.

Specifically, when the high frequency current is applied to the electro-magnetic coil in the vacuum to perform high-speed coating, the vibration of the coil winding part 130a significantly increases, to potentially cause serious cracks. Thus, since the possibility of the arcing increases, the high-speed coating may be limited.

In addition, since a large amount of heat is generated in the electro-magnetic coil itself when the high frequency current is applied to the electro-magnetic coil 130, cooling water should be circulated within the electro-magnetic coil 130 for the cooling thereof. As a result, the insulation structure 200 of the electro-magnetic coil 130 as shown in FIG. 2 may be overheated due to heat dissipation being blocked.

Also, in the related art dry coating apparatus 100 shown in FIG. 1, a feed-through 300 for stably applying the high frequency current to the coil is required in a portion of the vacuum chamber 120 through which the electro-magnetic coil 130, connected to a high frequency power source 132 disposed outside the vacuum chamber 120 to supply the high frequency current to the electro-magnetic coil 130, passes, is needed.

For example, technology with respect to the feed-through 300 of the electro-magnetic coil are disclosed in Korean patent application No. 2009-0092626 filed by the same applicant as that of this application.

In the case of the feed-through 300 disclosed in the patent application, since the feed-through 300 is provided on the assumption of the electro-magnetic coil in the vacuum, a separate feed-through part is eventually required in the related art. The feed-through may be relatively expensive and have a complicated structure.

Thus, in the related art dry coating apparatus 100, since at least a wound portion of the electro-magnetic coil for substantially levitating and heating the coating material to generate metal vapor is disposed in the vacuum, the separate components such as the insulation structure 200 or the feed-through 300 are necessarily required, as described above. Thus, the overall structure of the apparatus may be complicated. In addition, due to the heat generation in the electro-magnetic coil and the vibration in the coil winding part, it is difficult to apply the high frequency current. Therefore, it may be difficult to realize the high-speed coating.

An aspect of the present invention provides a dry coating apparatus in which an electro-magnetic coil that is a heating source is disposed in the atmosphere to remove the possibility of an arcing due to an existing electro-magnetic coil in a vacuum and to omit related components, thereby improve operation stability of the apparatus, and also, a simplified structure is enable and metal vapor generation capacity increases to realize high-speed coating, thereby improving productivity and reducing power consumption.

SUMMARY OF THE INVENTION

According to an aspect of the present invention, there is provided a dry coating apparatus including: a coating part disposed in a vacuum to coat deposition vapor generated through heating and evaporation of a supplied coating material onto a proceeding object to be coated; and a heating source disposed in the atmosphere to heat and evaporate the coating material in the coating part.

The dry coating apparatus may further include: a vacuum chamber through which the object to be coated passes using a sealing transfer roll as a medium and in which the coating part is disposed and the vacuum is maintained, and a coating material supply part connected to the coating part to pass through the vacuum chamber.

The heating source may include an electro-magnetic coil generating the deposition vapor through levitation and heating the coating material using electro-magnetic force, and the dry coating apparatus may further include a coating part and an electro-magnetic coil separation unit connected to the vacuum chamber or a flange connected to the vacuum chamber to separate the coating part in the vacuum from the electro-magnetic coil in the atmosphere.

The coating part may include: a deposition vapor generation part surrounded by the electro-magnetic coil by disposing the coating part and the electro-magnetic coil separation unit therebetween, the deposition vapor generation part levitating and heating the coating material supplied therein using the electro-magnetic force; and at least evaporation vapor injection part of an evaporation vapor induction part and the evaporation vapor injection part which are connected to the evaporation vapor generation part.

The coating part and the electro-magnetic separation unit may further include an insulation flange in which the deposition vapor generation part of the coating part is disposed, the insulation flange being connected to the vacuum chamber or the flange connected to the vacuum chamber using a sealing type coupling unit as a medium to maintain the vacuum.

The insulation flange may include: an insulation flange horizontal part connected to the vacuum chamber or the vacuum chamber-side flange in a sealed state using the sealing type coupling unit as a medium; and an insulation flange hollow part disposed in a center of the insulation flange horizontal part and spaced apart by a predetermined distance from the deposition vapor generation part, the insulation flange hollow part being surrounded and wound by the electro-magnetic coil disposed in the heat source.

The insulation flange may be formed of quartz, and the sealing type coupling unit may be spaced farther from the electro-magnetic coil than a radius of a winding part of the electro-magnetic coil wound around the insulation flange.

The sealing type coupling unit may include a flange assembly port to which the insulation flange horizontal part is closely attached, the flange assembly port being assembled with the chamber in which the sealing member is disposed or the vacuum chamber-side flange by disposing an elastomer therebetween.

The dry coating apparatus may further include a second assembly port additionally disposed on an upper portion of the vacuum chamber or the vacuum chamber-side flange, the second assembly port including a second cooling medium passage therein, wherein a cooling gas atmosphere may be provided around the electro-magnetic coil of the heating source or cooling water is circulated into the electro-magnetic coil.

The coating material supply part is connected to the coating part outside the vacuum chamber to supply a solid or liquid coating material to the coating part, and one or more heating units may be further disposed around the coating material supply part and the coating part.

According to the present invention, the metal vapor may be stably coated on the substrate, i.e., the surface of the steel strip proceeding at the high speed.

Furthermore, the heating source of the electro-magnetic coil for levitating and heating the metal vapor may be disposed in the atmosphere. Also, the deposition coating part for the metal vapor may be disposed in the vacuum. Thus, an arcing due to the existing electro-magnetic coil in the vacuum may be prevented. In addition, the dry coating apparatus may be stably operated for a long time.

Also, the more current with high frequency may be applied to the electro-magnetic coil under the same coating conditions. Thus, when the steel strip proceeds at the high speed, stable coating may be realized. Also, the feed-through and the insulation part for the vacuum placement of the related art electro-magnetic coil be omitted to simplify the equipment overall. In addition, power consumption may be minimized.

BRIEF DESCRIPTION OF DRAWINGS

The above and other aspects, features and other advantages of the present invention will be more clearly understood from the following detailed description taken in conjunction with the accompanying drawings, in which.

DETAILED DESCRIPTION OF THE INVENTION

Exemplary embodiments of the present invention will now be described in detail with reference to the accompanying drawings.

Figure 3:
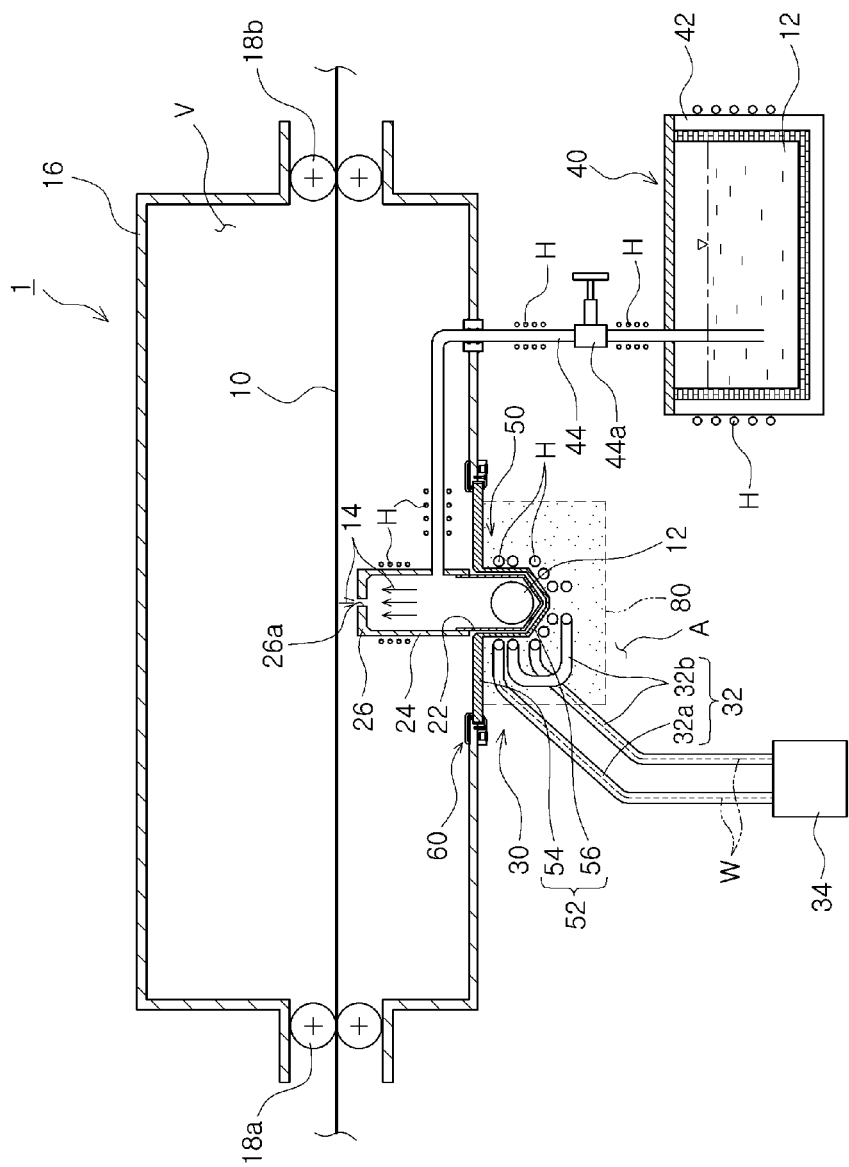
FIG. 3 is a front view illustrating an overall structure of a dry coating apparatus according to the present invention.
Figure 4:
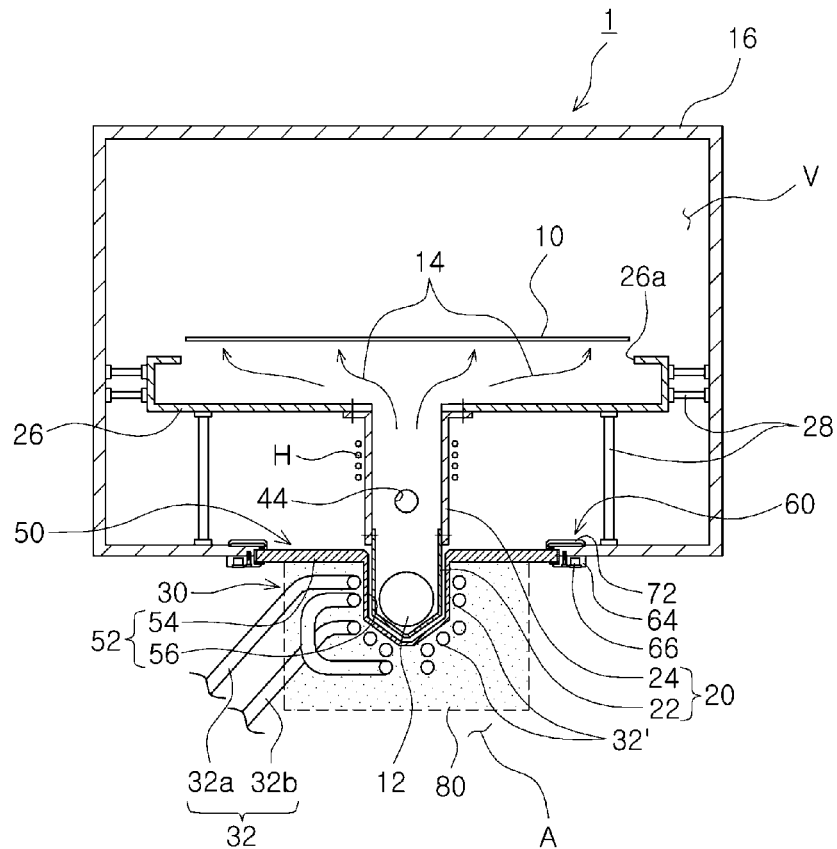
FIG. 4 is a side view of the dry coating apparatus according to the present invention.

FIGS. 3 and 4 are front and side views illustrating an overall structure of a dry coating apparatus 1 according to the present invention.

In the current embodiment, a (high-speed) proceeding steel strip 10 is described as an object 10 to be coated, and a molten metal 12 supplied to a crucible 42 of a coating material supply part 40 illustrated in FIG. 3 is described as a coating material 12.

Alternatively, the coating material 12 may be a solid (wire-type) coating material supplied from the coating material supply part 40 except for the molten metal 12. Also, metal vapor 14 is described as deposition vapor generated through levitating and heating.

Referring to FIGS. 3 and 4, the dry coating apparatus 1 of the present invention may include a coating part 20 disposed in a vacuum V so that the metal vapor (deposition vapor) 14 generated by levitating and heating the molten metal 12 using an electro-magnetic force is coated on the proceeding steel strip 10 and a heating source 30 provided in an atmosphere A to heat and evaporate the molten metal 12 in the coating part 20.

Figure 1:
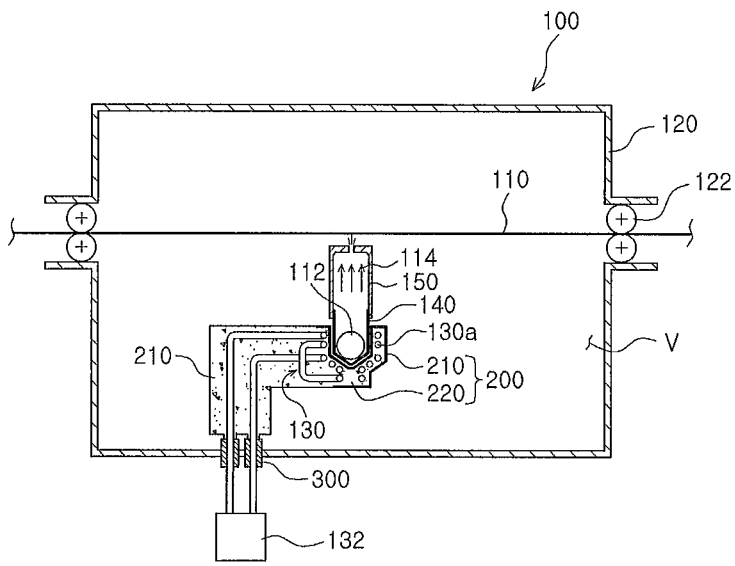
FIG. 1 is a schematic view of a dry coating apparatus according to a related art.
Figure 2:
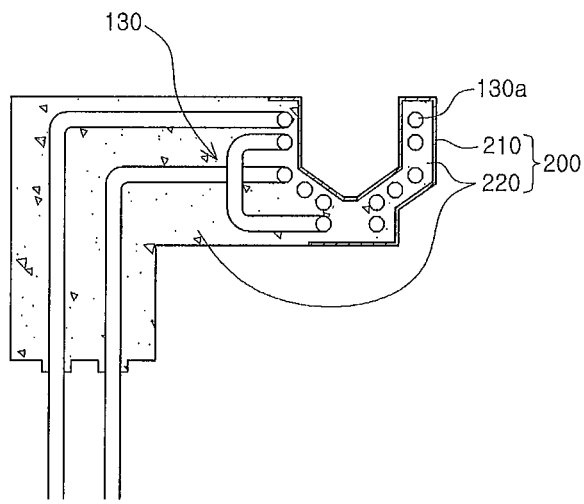
FIG. 2 is a view illustrating a main part of a levitation-heating electro-magnetic coil in the dry coating apparatus according to the related art.

Thus, in the dry coating apparatus 1, the coating part 20 for levitating and heating the supplied molten metal 12 to be evaporated is disposed in the vacuum V, and the heating source 30, i.e., an electro-magnetic coil 32 to be described later is disposed in the atmosphere A to essentially prevent arcing between the electro-magnetic coils 130 (specifically, turning portions of a winding part 130a) as shown in FIGS. 1 and 2.

Specifically, as shown in FIG. 2, since related components such as a feed-through 300 for disposing an existing electro-magnetic coil in a vacuum or an insulator 200 are unnecessary, an overall structure of the apparatus may be significantly simplified. Thus, manufacturing cost may be reduced.

Also, since the arcing dose not occur between the electro-magnetic coils in the atmosphere, a more current with high frequency may be applied under the same coating conditions. Thus, the steel strip 10 may be stably coated even in the case that the steel strip 10 proceeds at a quicker speed.

Therefore, in the dry coating apparatus 1 according to the present invention, manufacturing cost may be reduced and productivity may be improved.

Referring to FIGS. 3 and 4, in the dry coating apparatus 1 of the present invention, a vacuum chamber 16 through which the coating part 20 and the steel strip 10 pass in the vacuum is provided. Sealing transfer rolls 18a and 18b for stably guiding the steel strip 10 while sealing openings of the vacuum chamber 16 through which the steel strip 10 passes may be disposed on front and rear sides of the vacuum chamber 16.

The vacuum chamber 16 may be controlled to be maintained at a predetermined vacuum pressure through vacuum pumping mechanisms (not shown).

As shown in FIG. 3, a molten metal supply part 40 connected to the outside of the vacuum chamber 16 may be connected to the coating part 20 through the vacuum chamber 16.

As described above, the molten metal supply part 40 is not limited to only the supply of the molten metal having a liquid state. That is, a solid, for example, a metal to be coated may have a wire shape, and the wire may pass through the vacuum chamber 16 and be continuously supplied to the coating part 20.

As shown in FIG. 3, the molten metal supply part 40 includes the crucible 42 (into which a metal ingot may be inserted and melted) for storing the molten metal 12 and a molten metal supply tube 44 having one end immersed in the molten metal within the crucible 42 and the other end passing through the vacuum chamber 16 and connected to the coating part 30.

Here, heating units H may be provided on adequate positions around the crucible 42 and the molten metal supply tube 44. For example, the heating units H may be heater coils and prevent the molten metal from being reduced in temperature or condensed during the supply of the molten.

As shown in FIG. 3, a control valve 44a for controlling a supply amount of the molten metal onto the coating part 20 may be disposed in the molten metal supply tube 44.

Here, since the inside of the vacuum chamber 16 is in a vacuum and the crucible 42 for supplying the molten metal 12 is disposed in the atmosphere, a pressure difference of about 1 bar occurs between the vacuum and the atmosphere. Thus, the molten metal 12 may be sufficiently supplied to a metal vapor generation part 22 of the coating part 20 through the supply tube 44 when the control valve 44a is opened.

Thus, the supplied molten metal 12 is levitated and heated in the metal vapor generation part 22 when a high frequency current is applied to the electro-magnetic coil 32 of a heating source 30 that will be described later in detail to generate metal vapor 14. Then, the generated metal vapor 14 is continuously deposited and coated on the surface of the steel strip 10.

Figure 5:
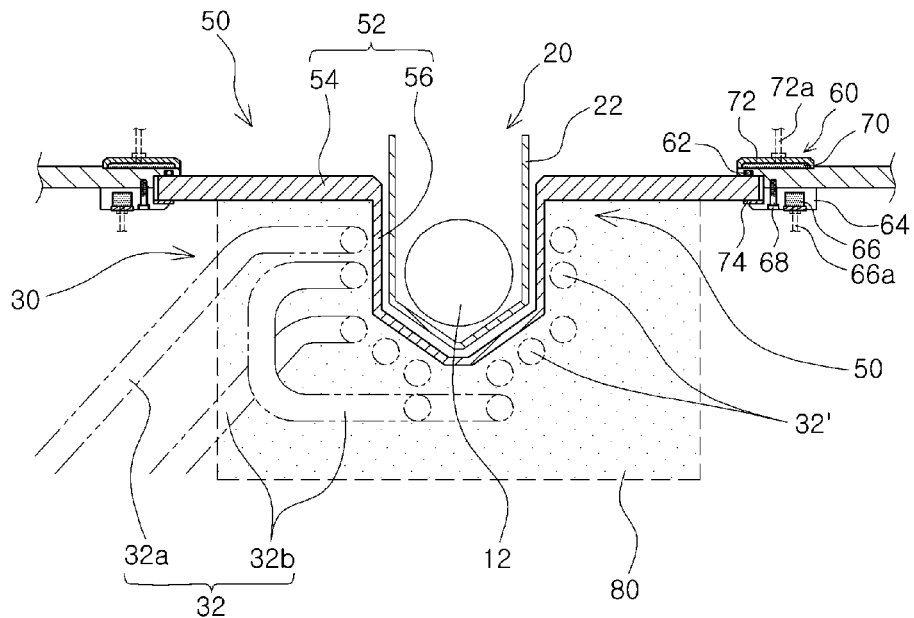
FIG. 5 is a view of a heating source (an electro-magnetic coil) installed in an atmosphere in the dry coating apparatus according to the present invention.
Figure 6:
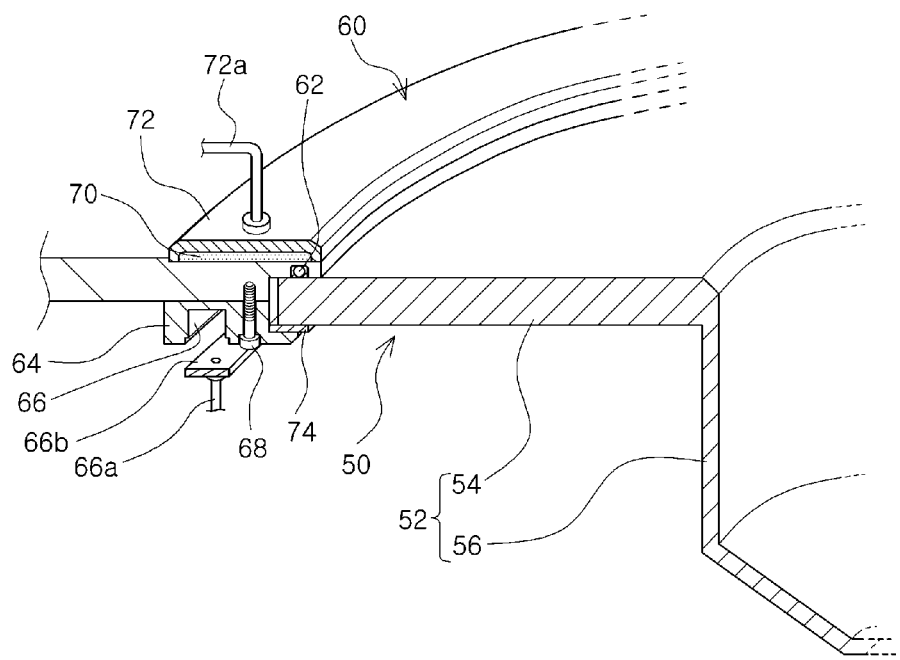
FIG. 6 is a perspective view illustrating a main part of the heating source of FIG. 5.

As shown in FIGS. 4 to 6, in the dry coating apparatus 1 of the present invention, a coating part and an electro-magnetic coil separation unit 50 that will later be described in detail are disposed to allow the electro-magnetic coil 32 of the heating source 30 to be wound around the outside of the coating part 20 which substantially performs the deposition and coating of the metal vapor 14 at a predetermined interval to surround the coating part 20.

Thus, when the high frequency current is applied to the electro-magnetic coil 32, a levitation force and a high-temperature heat due to the generated electro-magnetic force is generated (occurs) in the metal vapor 14 by the metal vapor generation part 22.

Here, the metal vapor generation part 22 provides a tube-shaped space in which the molten metal 12 supplied to an inner lower end thereof is levitated and heated by the electro-magnetic force to generate the metal vapor 14.

Also, as shown in FIGS. 3 and 4, a metal vapor injection part 26 may be connected to an upper portion of the metal vapor generation part 22 having a cylindrical shape of the coating part 20 using a metal vapor induction part 24 having a tube shape as a medium.

Thus, the metal vapor 14 generated by levitating and heating the molten metal 12 using the electro-magnetic force, i.e., evaporation vapor, is continuously deposited on the surface of the steel strip 10 proceeding through the metal vapor induction part 24 and the metal vapor injection part 26 to perform the dry coating.

Here, the metal vapor injection part 26 instead of the metal vapor induction part 24 may be directly connected to the metal vapor generation part 22.

As shown in FIG. 4, the metal vapor injection part 26 may have a box shape with an injection opening 26a having a length corresponding to a width of the steel strip 10.

Thus, the coating part 20 may have a "T" shape overall. Although not shown in the drawings, the injection hole 26a may have a shape in which holes are successively arranged or a slit shape in which a long groove is defined.

That is, as shown in FIG. 4, at least the metal vapor generation part 22 among the metal vapor generation part 22, the metal vapor induction part 24, and the metal vapor injection part 26 of the coating part 20 may be formed of a ceramic that is a non-conductive, a heat resistant material.

As shown in FIG. 4, the metal vapor generation part 22 having the cylindrical shape of the coating part 20 may be supported by a plurality of supports 28 connected to each other between the vacuum chamber 16 to maintain a certain distance from the coating part and an insulation flange 52 of the electro-magnetic coil separation unit 50.

Here, the distance between the metal vapor generation part 22 of the coating part 20 and a hollow part 56 of the insulation flange 52 is uniform on the whole. The narrower the distance is, the more the evaporation of the molten metal 12 by the levitation and heating may be facilitated.

A heating unit H, e.g., a heater coil, may be further provided on the inside (not shown) or outside of the metal vapor induction part 24 of the coating part 20 to additionally heat the metal vapor 14 so that the metal vapor 14 for high-speed coating is not coated on the metal vapor induction part 24, but is coated on the steel strip 10.

As shown in FIGS. 3 to 5, the heating source 30 includes the electro-magnetic coil 32 which generates the electro-magnetic force to levitate and heat the coating material, i.e., the supplied molten metal 12, thereby generating the metal vapor 14.

For example, the heating source 30 may include first and second electro-magnetic coils 32a and 32b wound around the coating part of the electro-magnetic coil 32 and the hollow part 56 of the insulation flange 52 of the electro-magnetic coil separation unit 50.

Here, the first and second electro-magnetic coils 32a and 32b generate strong induced eddy current in the supplied molten metal through interaction between magnetic fields between the electro-magnetic coils 32 generated by the high frequency current applied through an AC power supply 34 connected to the first and second electro-magnetic coils 32a and 32b and an induced current induced into the molten metal. Thus, the supplied molten metal is heated at a sufficiently high temperature in the levitation state and thus is evaporated to generate the metal vapor 14 as shown in FIGS. 3 and 4.

For example, a high frequency AC current of about 1 kHz to about 1,000 kHz may be applied to the first and second electro-magnetic coils 32a and 32b of the heating source 30 through the AC power supply 34. The electro-magnetic force is generated in the electro-magnetic coil 32 by the applied high frequency AC current. Also, the molten metal 12 is heated to a high temperature by an induction-heating principle while being levitated by a Lorentz force and thus is evaporated to generate the metal vapor 14.

As shown in FIGS. 3 to 5, the first and second electro-magnetic coils 32a and 32b are spaced apart by a predetermined distance from each other. The first electro-magnetic coil 32a may be wound in a cylindrical shape to surround the metal vapor generation part 22 having the cylindrical shape and the hollow part 56 of the insulation flange 52. The second electro-magnetic coil 32b may be wound in a conical shape which is gradually narrowed so as to easily apply levitation force to the molten metal. Here, in the drawings, reference numeral 32 represents winding parts of the first and second electro-magnetic coils 32a and 32b.

Although schematically illustrated in FIGS. 3 and 4, the upper first electro-magnetic coil 32a and the lower second electro-magnetic coil 32b of the electro-magnetic coil 32 may be wound in opposing directions. This is done because offsetting magnetic fields are generated within the coils due to the currents flowing in opposite directions, to more stably levitate and heat the molten metal.

As described above, the heating source 30 is disposed in the atmosphere. Thus, since the arcing due to the existing in the vacuum is not generated, a distance between the first and second coils 32a and 32b may be narrower as compared to that of the related art dry coating apparatus 100 of FIG. 1. In this case, the heat generation amount may further increase even in the case that the same high frequency current is applied.

However, if the distance between the coils 32a and 32b is significantly narrow, heat may be excessively and abnormally generated. Thus, it may be necessary to maintain an adequate distance therebetween.

The first and second electro-magnetic coils 32a and 32b include the winding part 32' having the same central line. Here, the levitation position of the molten metal may be defined corresponding to the center of the first and second electro-magnetic coils 32a and 32b.

Referring to FIGS. 5 and 6, the dry coating apparatus 1 includes the coating part and the electro-magnetic coil separation unit 50. The coating part and the electro-magnetic coil separation unit 50 may be connected to the vacuum chamber 16 or the insulation flange 52 connected to the vacuum chamber 16 in a sealed state so that the coating part 20 in the vacuum and the electro-magnetic coil 32 in the atmosphere are separated from each other.

That is, as shown in FIGS. 5 and 6, the coating part and the electro-magnetic coil separation unit 50 may be connected to the vacuum chamber 16 or the other flange connected to a vacuum chamber (not shown) using a sealing type coupling unit 60 as a medium to maintain the vacuum state. Also, the coating part and the electro-magnetic coil separation unit 50 may include the insulation flange 52 in which the metal vapor generation part 22 of the coating part 20 is disposed.

The insulation flange 52 includes an insulation flange horizontal part 54 and an insulation flange hollow part 56. The insulation flange horizontal part is connected to the vacuum chamber 16 or the vacuum chamber-side flange in the sealed state through the sealing type coupling unit 60 as the medium. The insulation flange hollow part 56 is integrated or welded to a center of the insulation flange horizontal part 56. Also, the metal vapor generation part 22 having the tube shape is inserted into the insulation flange hollow part 56 while maintaining a predetermined distance. Also, the electro-magnetic coil 32 disposed on the heating source 30 surrounds and winds an outer circumference of the insulation flange hollow part 56 at a predetermined interval.

Since the insulation flange 52 separates the electro-magnetic coil 32 from the metal vapor generation part 22 in the vacuum, the insulation flange 52 may be formed of a material which is an electrical non-conductor that is not affected by the electro-magnetic force, having superior stable durability at the high temperature required for the levitation and heating, and superior mechanical strength or processability. Thus, the insulation flange 52 may be formed of quartz.

That is, as shown in Table 1, the quartz may generally satisfy the above-described conditions when compared to ceramic or polymer.

Table 1

TABLE 1

| Classification | Electrical non-conductivity | High-temperature durability | Mechanical strength | Machineability | Notes |
|---|---|---|---|---|---|
| Quartz | Superior | Superior | Normal | Normal | Machining and welding allowable |
| Ceramic | Superior | Superior | Superior | Weak | Brittle and thermal shock |
| Polymer | Superior | Weak | Normal | Superior | Absence of High-temperature durability |

That is, the quartz forming the insulation flange 52 may have a softening point temperature of about 1,600° C., a hardness of about 570 kHN, a tension strength of about $4.8 \times 10^7$ Pa, and a compressive strength of about $1.1 \times 10^9$ Pa.

Thus, the insulation flange 52 may be manufactured to have the horizontal part 54 and the hollow part 56 by machining or welding quartz. Also, since the insulation flange 52 has durability at high temperatures, the metal vapor 14 may be sufficiently generated in the metal vapor generation part 22 of the coating part 20 even in the case that the electro-magnetic coil 32 is wound around the insulation flange 52.

FIGS. 5 and 6 illustrate the sealing type coupling unit 60 for connecting the coating part and the horizontal part 54 of the insulation flange 52 of the electro-magnetic coil separation part 50 to the vacuum chamber 15 or the vacuum chamber-side flange (not shown) in the sealing state. The sealing type coupling unit 60 may be spaced farther from the electro-magnetic coil 32 than a radius of the electro-magnetic coil winding part 32' wound on the outer circumference of the hollow part 56 of the insulation flange 52 at the predetermined interval.

For example, when a distance between the sealing type coupling unit 60 and the electro-magnetic coil 32 is less than the radius of the winding part 32', a sealing member 62 or an elastomer of the sealing type coupling unit 60 may be melted by heat.

Even so, if the distance between the sealing type coupling unit 60 and the electro-magnetic coil 32 unlimitedly increases, a diameter (size) of the horizontal part 54 of the insulation flange 52 may be excessively increased. Thus, the insulation flange may be weak in terms of strength and easily damaged by external impacts. Thus, the sealing type coupling unit 60 may be disposed far away from the radius of the electro-magnetic coil winding part 32'.

As shown in FIG. 6, the sealing type coupling unit 60 includes a flange assembly port 64 to which the insulation flange horizontal part 54 is closely attached and assembled with the chamber 16 including the sealing member 62 or the vacuum chamber-side flange.

That is, a groove is defined in a side of the chamber, and the sealing member 62 such as an O-ring or packing is mounted on the groove. Also, the elastomer 74 is disposed below the horizontal part 54 to insert the horizontal part 74 therebetween. Thus, the flange assembly port 64 may be firmly assembled with the chamber using a bolt 68.

Here, the elastomer 74 may be an impact absorbing body for absorbing external impacts in the case that external impact are applied when or after the horizontal part 54 of the insulation flange 52 formed of quartz is assembled.

The elastomer may be disposed above and below the horizontal part 54. The sealing member 62 may be mounted by processing the quartz of the chamber or chamber-side flange than that of the horizontal part 54, and vice versa.

Here, a cooling medium passage 66 is integrally formed in the flange assembly port 64, and a cover ring 66b is welded to seal the flange assembly port 64. Then, a cooling water circulation tube 66a (actually, a cooling water supply and discharge tube) is connected to the flange assembly port 64. Thus, the cooling water is circulated to prevent the sealing member 62 or the elastomer 74 from being damaged by high-temperature heat generated in the electro-magnetic coil.

As shown in FIGS. 5 and 6, a second assembly port 72 having a second cooling medium passage 70 is jointed to an upper portion of the vacuum chamber or the vacuum chamber-side flange through welding. Then, a cooling water circulation tube 72a is connected to the second assembly port 72 to additionally circulate the cooling water.

Through the circulation of the cooling water, high-temperature heat may be prevented from being transferred into a structure of the chamber through the insulation flange and also prevent a life cycle of the equipment from being reduced due to heat.

As shown in FIGS. 3 and 5, a cooling gas atmosphere layer 80 may be formed around the electro-magnetic coil 32 of the heating source 30, i.e., at least the electro-magnetic coil winding part 32'. For example, a gas (a cooling gas) may be continuously supplied around the electro-magnetic coil winding part 32' to form the cooling gas atmosphere layer 80.

Although schematically illustrated in the drawings, a cooling water W may be circulated in the electro-magnetic coil 32 as shown in FIGS. 3 and 5. For example, the cooling water W may be circulated along a hollow within the electro-magnetic coil 32, and the cooling water supply and discharge tube may be connected to one side and the other side of the electro-magnetic coil 32.

Thus, according to the present invention, it may primarily prevent the electro-magnetic coil 32 from being overheated or the high-temperature heat from being transferred to the chamber through a multi-cooling structure of the sealing type coupling unit 60, the cooling gas atmosphere layer 80 around the electro-magnetic coil winding part 32' and the cooling water circulation within the electro-magnetic coil 32.

Thus, since the heating source, i.e., the electro-magnetic coil 32 is disposed in the atmosphere; an arcing in the existing vacuum state may be prevented. Also, since more current with high frequency is applied to the electro-magnetic coil 32 to sufficiently generate the metal vapor 14, the sufficient coating may be realized even in the case that the steel strip proceeds at high speed. Also, due to the sufficient cooling structure, overheating may be prevented.

Figure 7:
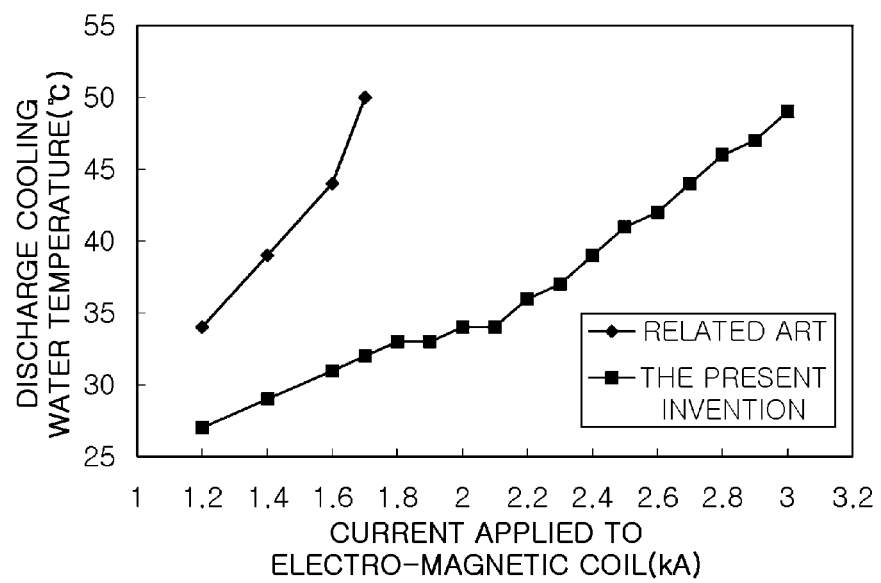
FIG. 7 is a graph illustrating a cooling water temperature in the electro-magnetic coils according to the related art and the present invention.

Referring to FIG. 7, when the high frequency current applied to the electro-magnetic coil 32 increases, it may easily get out of a cooling limitation to cause overheating and water hammering of the cooling water W in the related art. However, in case of the present invention in which the electro-magnetic coil is disposed in the atmosphere, a cooling temperature may be stably maintained.

That is, in case of the related art coating apparatus 100 of FIG. 1, a maximum current applicable to the electro-magnetic coil 130 is limited. This is done because a temperature difference between the inlet water and the outlet water of the cooling water circulating the electro-magnetic coil 130 is about 30° C., and thus water hammering easily occurs within the electro-magnetic coil 130 by the overheating of the cooling water. Thus, since the vibration of the electro-magnetic coil 130 may be significantly increased, it may be difficult to increase a maximum current beyond about 1.7 KA.

Specifically, it may be difficult to stably maintain the coating due to (occasional) an arcing in the electro-magnetic coil 130. Thus, in case of zinc coating of the steel strip, a maximally securable coating speed is just about 60 μm·m/min.

However, in case of the dry coating apparatus 1 according to the present invention, as shown in FIG. 7, a maximum current applicable to the electro-magnetic coil 32 is about 3.0 KA, greater by 1.8 times that of the related art dry coating apparatus 100.

As shown in FIG. 7, a temperature difference between the inlet water and the outlet water of the cooling water W circulating the electro-magnetic coil 32 is about 28° C. Thus, the dry coating apparatus 1 may have superior cooling efficiency when compared to that of the related art dry coating apparatus 100. This is done because the insulation structure 200 due to the existing electro-magnetic coil 130 disposed in the vacuum condition is omitted in the present invention to more effectively dissipate heat.

Also, the related art feed-through 300 illustrated in FIG. 1 may be omitted to reduce power consumption.

Therefore, based on the above-described various environments, the related art zinc coating speed is only about 60 μm·m/min. However, in case of the present invention, the maximum coating speed may increase up to about 200 μm·m/min. Thus, since the coating is stably performed even in the case that the steel strip proceeds at a high speed, productivity may be significantly improved.

While the present invention has been shown and described in connection with the exemplary embodiments, it will be apparent to those skilled in the art that modifications and variations can be made without departing from the spirit and scope of the invention as defined by the appended claims.

The present invention provides a dry coating apparatus in which an electro-magnetic coil that is a heating source is disposed in the atmosphere to remove the possibility of an arcing due to an existing electro-magnetic coil in a vacuum and to omit related components, thereby improve operation stability of the apparatus, and also, the apparatus has a simplified structure and metal vapor generation capacity increases to improve productivity and reduce power consumption.

The invention claimed is:

1. A dry coating apparatus comprising:
   a vacuum chamber through which an object to be coated passes using a sealing transfer roll and in which a vacuum is maintained;
   a coating part provided in the vacuum chamber, the coating part configured to coat the object to be coated with a deposition vapor generated through heating and evaporation of a supplied coating material;
   a coating material supply part connected to the coating part and passing through the vacuum chamber;
   a heating source provided in an atmosphere to heat and evaporate the coating material in the coating part, wherein the heating source comprises an electro-magnetic coil generating the deposition vapor through levitation and heating the coating material using electro-magnetic force; and
   an electro-magnetic coil separation unit including the coating part and connected to the vacuum chamber or a flange connected to the vacuum chamber to separate the coating part in the vacuum from the electro-magnetic coil in the atmosphere,
   wherein the coating part comprises:
      a deposition vapor generation part surrounded by the electro-magnetic coil by interposing the electro-magnetic coil separation unit between the deposition vapor generation part and the electro-magnetic coil, the deposition vapor generation part levitating and heating the coating material supplied therein using the electro-magnetic force; and
      an evaporation vapor induction part and an evaporation vapor injection part which are connected to an upper portion of the deposition vapor generation part,
   wherein the electro-magnetic separation unit further comprises an insulation flange in which the coating part is disposed, the insulation flange being connected to the vacuum chamber or the flange connected to the vacuum chamber using a sealing type coupling unit as a medium to maintain the vacuum; and
   wherein the insulation flange comprises:
      an insulation flange horizontal part connected to the vacuum chamber or the vacuum chamber-side flange in a sealed state using the sealing type coupling unit as a medium, wherein a connecting portion of the upper portion connecting the vapor generation part with the evaporation induction part is above the insulation flange horizontal part; and
      an insulation flange hollow part disposed in a center of the insulation flange horizontal part and spaced apart by a predetermined distance from the deposition vapor generation part, the insulation flange hollow part being surrounded and wound by the electro-magnetic coil; and
   wherein the coating material supply part is connected to the evaporation vapor induction part of the coating part and passing through the vacuum chamber to supply a solid or liquid coating material to the coating part.

2. The dry coating apparatus of claim 1, wherein the insulation flange is formed of quartz, and the sealing type coupling unit is spaced farther from the electro-magnetic coil than a radius of a winding part of the electro-magnetic coil wound around the insulation flange.

3. The dry coating apparatus of claim 1, wherein the sealing type coupling unit comprises a first assembly port to which the insulation flange horizontal part is attached, the first assembly port being assembled with the chamber in which the sealing type coupling unit is disposed or the vacuum chamber-side flange by disposing an elastomer therebetween,
   wherein the first assembly port comprises a first cooling medium passage therein.

4. The dry coating apparatus of claim 3, further comprising a second assembly port additionally disposed on an upper portion of the vacuum chamber or the vacuum chamber-side flange, the second assembly port comprising a second cooling medium passage therein,
   wherein a cooling gas atmosphere is provided around the electro-magnetic coil of the heating source or cooling water is circulated into the electro-magnetic coil.

5. The dry coating apparatus of claim 1, wherein one or more heating units are further disposed around the coating material supply part and the coating part.

* * * * *